United States Patent [19]

Wright

[11] Patent Number: 4,503,140
[45] Date of Patent: Mar. 5, 1985

[54] RADIATION-SENSITIVE COMPOSITIONS OF POLYMERS CONTAINING A $\pi$-METAL CARBONYL COMPLEX OF CONJUGATED POLYOLEFIN

[75] Inventor: Robin E. Wright, Inver Grove Heights, Minn.

[73] Assignee: Minnesota Mining and Manufacturing Company, St. Paul, Minn.

[21] Appl. No.: 379,341

[22] Filed: May 18, 1982

[51] Int. Cl.$^3$ ................................................ G03C 1/71
[52] U.S. Cl. ..................... 430/289; 430/270; 430/923; 430/927; 204/159.14
[58] Field of Search ............... 430/923, 927, 270, 296, 430/289, 936; 204/159.14

[56] References Cited

U.S. PATENT DOCUMENTS

| 4,127,506 | 11/1978 | Gray et al. | 204/159.14 X |
| 4,252,671 | 2/1981 | Smith | 430/286 X |
| 4,252,675 | 2/1981 | Smith | 430/286 X |
| 4,252,676 | 2/1981 | Smith | 430/286 X |
| 4,361,497 | 11/1982 | Boldt et al. | 204/159.14 X |

FOREIGN PATENT DOCUMENTS 1463816  2/1977  United Kingdom .

OTHER PUBLICATIONS

Charles U. Pittman, Jr., et al., "Copolymerization of Styrenetricarbonylchromium and the Reaction of Polystyrene with Chromium, Molybdenum, and Tungsten Hexacarbonyl", American Chemical Society, Div. Org. Coatings Plast. Chem., vol. 31, No. 2, pp. 325–329, (1971).

Pittman, Charles U. Jr., "Vinyl Polymerization of Organic Monomers Containing Transition Metals", pp. 1–61, of vol. 6 of a monographic series titled Organometallic Reactions, edited by E. I. Becker and M. Tsutsui, Interscience Publishers, (1977).

Wagner, H. M. and Purbrick, M. D., "Transition Metal Carbonyl Derivatives as Photopolymerization Initiators and Photocrosslinking Agents in Photoresists", R.P.S. Conference, Cambridge, England, (1981).

*Primary Examiner*—John E. Kittle
*Assistant Examiner*—Cynthia Hamilton
*Attorney, Agent, or Firm*—Donald M. Sell; James A. Smith; Lorraine R. Sherman

[57] ABSTRACT

Radiation-sensitive polymeric compositions containing metal-carbonyl complexes and the cured insoluble crosslinked resin produced therefrom are disclosed. When coated as a layer on a substrate, the composition is useful as an element in the graphic arts.

19 Claims, No Drawings

RADIATION-SENSITIVE COMPOSITIONS OF POLYMERS CONTAINING A π-METAL CARBONYL COMPLEX OF CONJUGATED POLYOLEFIN

TECHNICAL BACKGROUND

This invention relates to a radiation-sensitive polymeric composition containing metal-carbonyl complexes. In another aspect, it relates to the radiation cured insoluble crosslinked resin produced from the abovementioned composition. When coated as a layer upon a substrate, the composition has utility as a graphic arts imaging film.

BACKGROUND ART

Radiation-sensitive compositions suitable for use in radiation-sensitive elements including printing plates, information recording materials, and photoresists, are well known in the art. These prior art compositions are generally based on one or more unsaturated components, i.e., systems containing ethylenically-unsaturated material which can be polymerized or crosslinked by exposure to radiation such as ultraviolet, visible light, electron beam, infrared, or gamma radiation.

Metal complexes of cyclopolyolefins, particularly ferrocene (a π-complex of iron and cyclopentadiene), have been the subject of extensive research during the last 20 years. More recently, investigation has been made of polymers of ethylenically-substituted metal π-complexes of polyolefins with much of the state of the current art being presented in a summary by Pittman et al., Am. Chem. Soc., Div. Org. Coatings Plast. Chem., 31 (2), 325-9 (1971) and in Chap. 1, "Vinyl Polymerization of Organic Monomers Containing Transition Metals," by Charles U. Pittman, Jr., pp. 1-61, of Vol. No. 6 of a monographic series titled "Organometallic Reactions", edited by E. I. Becker and M. Tsutsui, Interscience Publishers (1977). It is disclosed on page 28 and 29 of the last publication that the copolymer of vinylcyclopentadienylcarbonylmanganese and N-vinyl-2-pyrrolidone (not a nucleophilic monomer) can be crosslinked, with evolution of carbon monoxide, when heated to 260° C. This thermal reaction appears to result in oxidation of the carbonylmanganese moiety. Crosslinking does not occur via coordination of the ring-containing nitrogen atom with the manganese atom.

Wagner, H. M. and Purbrick, M. D., "Transition Metal Carbonyl Derivatives as Photopolymerization Initiators and Photocrosslinking Agents in Photoresists", R.P.S. Conference, Cambridge, England (1981) relates to transition metal carbonyls useful in the formulation of photoresists and presensitized lithographic plates. In particular, it discloses the photoinitiated crosslinking of a polymer having one nucleophilic group with mono-metal-carbonyls, preferably (benzene)chromium tricarbonyl. It appears that the photoinduced crosslinking proceeds by an oxidation reaction of the present invention which is different from the simple displacement reaction that occurs upon photoinduced crosslinking of a nucleophilic group-containing polymer and a bis-metal-carbonyl.

To applicant's knowledge there is no prior art report of polymers resulting from the radiation induced crosslinking of a composition of polymers of ethylenically-substituted metal-carbonyl complexes of cyclopolyolefins and a crosslinking compound having at least one nucleophilic group, nor is there prior art teaching polymers resulting from the use of a compound having a plurality of metal-carbonyl units to crosslink a polymer having units from a monomer having at least one nucleophilic group.

SUMMARY OF THE INVENTION

Briefly, the present invention provides (1) a radiation-sensitive film-forming composition and (2) radiation-sensitive elements comprising a substrate bearing a layer of the radiation-sensitive composition. The composition, on exposure to radiation, cures rapidly to an insoluble crosslinked resin. The radiation-crosslinkable composition is a coatable composition comprising: (1) a radiation-sensitive π-bonded metal-carbonyl complex of a conjugated polyolefin, and (2) a nucleophilic group-substituted compound. Specifically, four embodiments are contemplated by the invention.

As used therein:
"monomer 1" is a conjugated polyolefin substituted by both a polymerizable ethylenically-unsaturated group and by a π-bonded metal carbonyl group;
"monomer 2" is an ethylenically unsaturated monomer containing at least one nucleophilic group; and
"monomer 3" is a non-nucleophilic group-containing ethylenically unsaturated monomer.

Embodiment I is a composition comprising a copolymer of
(a) units derived from monomer 1,
(b) units derived from monomer 2, and
(c) optionally, units derived from monomer 3.

Embodiment II is a composition comprising:
(a) a polymer having units derived from monomer 1, and
(b) a non-polymeric polynucleophilic compound having two to four nucleophilic groups.

Embodiment III is a composition comprising:
(a) a polymer of units derived from monomer 1, and
(b) a polymer of units derived from monomer 2.

Embodiment IV is a composition comprising:
(a) a polymer of monomer 2, and
(b) a non-polymeric organic compound substituted by two or more π-bonded metal-carbonyl groups.

It is further contemplated by the invention that the composition can comprise any combination of the four embodiments.

As used in this application:
"conjugated polyolefin that is substituted by an ethylenically-unsaturated group" means a linear or cyclic hydrocarbon that contains a

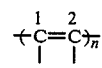

group, wherein n equals 2 or 3, that is substituted on carbon 1 or 2 or a carbon attached to carbon 1 or 2 with an ethylenically unsaturated group;

"nucleophilic group" means a group having an unshared pair of electrons, which electrons can subsequently form a coordinate covalent bond with a metal atom;

"polynucleophile" means an organic compound containing two or more nucleophilic groups;

"non-nucleophilic counterion" means an anion that does not have a pair of electrons that is basic enough to form a coordinate bond; and "units derived from" monomers 1, 2, or 3, is the expression used to indicate the structure taken by an ethylenically unsaturated monomer on polymerization. Thus,

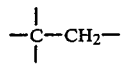

is the "unit derived from" a monomer having an ethylenically unsaturated group,

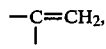

which results from the catalytically initiated polymerization of the monomer.

DETAILED DESCRIPTION OF THE INVENTION

Metal-carbonyl complexes on exposure to radiation lose a molecule of carbon monoxide, leaving an unstable electronically unsaturated fragment which then adds a nucleophilic ligand to complete a complement of 18 electrons in the coordination sphere of the metal. When the ligand is strongly nucleophilic, as is the case with amino and phosphino ligands, a stable, strong bond is formed. The formation of this bond becomes the means for providing crosslinking between polymer chains having both metal-carbonyl complex groups and nucleophilic groups (Embodiment I), the crosslinking of a polymer chain having pendant metal-carbonyl complex groups with a compound having two or more nucleophilic groups (Embodiment II), the crosslinking of a polymer having metal-carbonyl complex groups with a polymer having nucleophilic groups (Embodiment III), and the crosslinking of a polymer having nucleophilic groups with a compound having two or more metal-carbonyl complex groups (Embodiment IV). Thus, a polymer having units of vinylcyclopentadienyltricarbonylmanganese and units of 4-vinyl pyridine on exposure to radiation is crosslinked in Embodiment I by a mechanism such as, for example, when a unit of the copolymer:

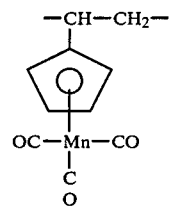

reacts under the influence of actinic radiation with a nucleophilic group-containing second unit either on the same polymer chain in which the first unit is present or on another molecule of the polymer, the second unit having the structure, for example:

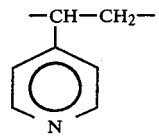

(derived from 4-vinyl pyridine)

with loss of carbon monoxide and formation of a crosslink bond and a copolymer unit having the structure:

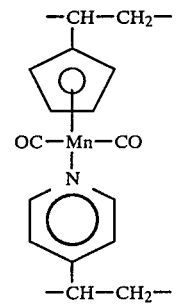

In Embodiment II, crosslinking takes place upon irradiation in accordance with the equation:

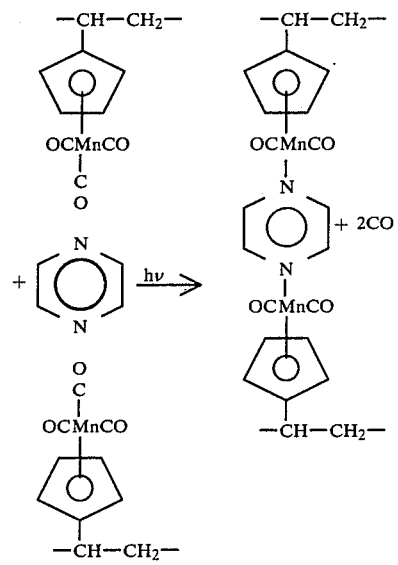

in which

is pyrazine, but could be replaced by any compound having at least two nucleophilic groups.

In Embodiment III, crosslinking takes place upon irradiation by a mechanism similar to that illustrating Embodiment I, the copolymer units, as for example, vinylcyclopentadienyltricarbonylmanganese units, and the nucleophilic group-containing units, as for example, vinyl pyridine units, however, being on different polymer chains.

In Embodiment IV, crosslinking takes place by a mechanism such as, for example, where a polymer having nucleophilic groups such as vinyl pyridine (structure given above) reacts under the influence of actinic radiation with an organic compound substituted by two or more π-bonded metal-carbonyl groups such as, for example, 1,3-bis[(η⁵-cyclopentadienyl)(tricarbonylmanganese)carbonyl]benzene in accordance with the equation:

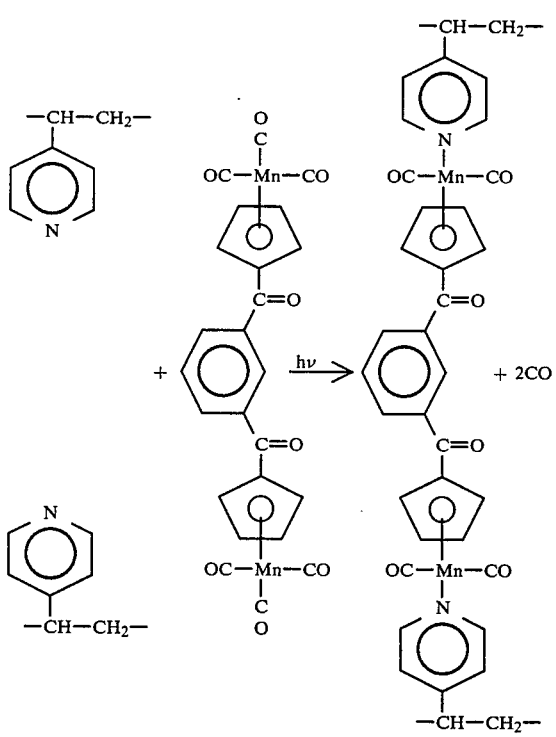

Preferably, the radiation-sensitive composition of the invention comprises a film-forming, radiation-crosslinkable composition comprising at least 10 percent by weight of I, II, III, and IV wherein: I is equal to 0 to 100 percent by weight of a copolymer comprising:
  (a) 5 to 60 mol percent of units derived from monomer 1,
  (b) 5 to 40 mol percent of units derived from monomer 2,
  (c) 0 to 90 mol percent of units derived from monomer 3; and
II is equal to 0 to 100 percent by weight of a composition comprising:
  (a) 75 to 95 percent by weight of a copolymer comprising:
    (1) 5 to 60 mol percent of units derived from monomer 1, and
    (2) 95 to 40 mol percent of units derived from monomer 3, and
  (b) 25 to 5 percent by weight of a polynucleophile; and
III is equal to 0 to 100 percent by weight of composition comprising:
  (a) 10 to 80 percent by weight of a polymer comprising 5 to 60 mol percent of units derived from monomer 1, and 95 to 40 mol percent of units derived from monomer 3, and
  (b) 90 to 20 percent by weight of a polymer comprising 5 to 100 mol percent of units derived from monomer 2, and 95 to 0 mol percent of units derived from monomer 3; and
IV is equal to 0 to 100 percent by weight of a composition comprising:
  (a) 75 to 95 percent by weight of a copolymer comprising:
    (1) 5 to 100 mol percent of units derived from monomer 2, and
    (2) 95 to 0 mol percent of units derived from monomer 3, and
  (b) 25 to 5 percent by weight of a non-polymeric organic compound substituted by two to four π-bonded metal-carbonyl groups; and
up to 90 percent by weight of organic polymeric binders, fillers, or adjuvants;
wherein
  monomer 1 is a conjugated polyolefin substituted by an ethylenically-unsaturated group and π-bonded to a metal-carbonyl group and having the formula:

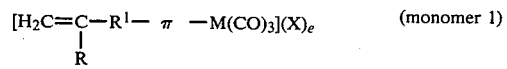

wherein
R is hydrogen or methyl;
R¹ is (1) a covalent bond, or (2) a divalent group,

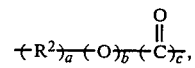

in which R² is an alkylene or alkyenylene group having 1 to 4 carbon atoms, a, b, and c are independently zero or one, but at least one of a, b, and c is one;
π is a cyclic or linear conjugated polyolefinic ligand that provides 4 to 7 π electrons to the valence shell of M and has 4 to 7 carbon atoms, one of which is attached to the covalent bond or divalent group R¹, said π optionally being substituted by halogen and lower alkyl groups having 1 to 6 carbon atoms or by a fused benzo group;
M is a metal selected from chromium, molybdenum, tungsten, manganese, and iron;
X is a non-nucleophilic counterion;
e is zero or one, e being zero when the sum of electrons available from 3CO groups, the conjugated polyolefin and the metal is equal to 18, and e being one when the aforementioned sum is equal to 19;
monomer 2 is an ethylenically-unsaturated monomer having at least one pendent nucleophilic group and being copolymerizable with monomer 1;
monomer 3 is an ethylenically-unsaturated monomer that is copolymerizable with monomers 1 and 2 and does not contain a nucleophilic or metal-carbonyl group.

As mentioned above, a polynucleophile is an organic compound containing two or more nucleophilic groups. Suitable polynucleophilies are compounds having nucleophilic groups which will displace tetrahydrofuran from (cyclopentadienyl)(tetrahydrofuran)dicarbonylmanganese in solution in tetrahydrofuran at about 25° C. under nitrogen in less than one hour.

A non-nucleophilic counterion (X in the above formula) is an anion which will not displace tetrahydrofuran from (cyclopentadienyl)(tetrahydrofuran)dicarbonylmanganese in solution in tetrahydrofuran at about 25° C. under nitrogen in less than one hour. Examples of such counterions include those having the formula $MQ_d$, wherein M is a metal or metalloid, Q is a halogen radical, and d is an integer having a value of 4 to 6 inclusive. Examples of counterions are $AsF_6^{-1}$, $SbF_6^{-1}$, $BF_4^{-1}$, $FeCl_4^-$, and $PF_6^{-1}$. Also included are counterions such as $CF_3SO_4^-$, $C_6H_5SO_3^-$, $ClO_4^-$, and $(C_6H_5)_4B^-$.

Exemplary ethylenically-unsaturated group-substituted conjugated polyolefin-π-bonded metal carbonyl complexes of use as monomer 1 in the compositions of the invention include the following:
(vinylcyclopentadienyl)tricarbonylmanganese
(1-vinyl-2-methylcyclopentadienyl)tricarbonylmanganese
(1-vinyl-3-methylcyclopentadienyl)tricarbonylmanganese
(1-vinyl-2-trifluoromethylcyclopentadienyl)tricarbonylmanganese
(1-vinyl-3-chlorocyclopentadienyl)tricarbonylmanganese
(propen-2-ylcyclopentadienyl)tricarbonylmanganese
(acryloylcyclopentadienyl)tricarbonylmanganese
(methacryloylcyclopentadienyl)tricarbonylmanganese
(acryloyloxycyclopentadienyl)tricarbonylmanganese
(vinyloxycyclopentadienyl)tricarbonylmanganese
(1-methacryloyl-2-chlorocyclopentadienyl)tricarbonylmanganese
(1-acryloyloxy-3-chlorocyclopentadienyl)tricarbonylmanganese
(acryloyloxymethylcyclopentadienyl)tricarbonylmanganese
[(4-acryloyloxybutyl)cyclopentadienyl]tricarbonylmanganese
(1-vinyl-3-n-hexylcyclopentadienyl)tricarbonylmanganese
(1-vinyl-1H-inden-1-yl)tricarbonylmanganese
(1-vinyl-3-methylcyclopentadienyl)tricarbonyliron(+1)hexafluoroantimonate
(1-acryloyl-3-methylcyclopentadienyl)tricarbonyliron(+1)hexafluorophosphate
(2,4-hexadienyl-1-yl acrylate)tricarbonyliron
(2-acryloylbuta-1,4-diene)tricarbonyliron
(styrene)tricarbonylchromium
(styrene)tricarbonylmolybdenum
(styrene)tricarbonyltungsten
(1-vinyl-2-methylbenzene)tricarbonylchromium
(1-vinyl-4-methylbenzene)tricarbonylmolybdenum
(1-vinylnaphthalene)tricarbonylchromium
(styrene)tricarbonylmanganese(+1)hexafluoroantimonate
(acryloylbenzene)tricarbonylmanganese(+1)tetrafluoroborate
(vinylcycloheptatrienyl)tricarbonylchromium(+1)hexachlorostannate
(vinylcycloheptatrienyl)tricarbonylmolybdenum(+1)tetraphenylborate
(acryloylcycloheptatrienyl)tricarbonyltungsten(+1)hexafluorophosphate The film-forming, radiation-crosslinkable, conjugated polyolefin metal-carbonyl-containing polymers are prepared by the addition polymerization of one or more ethylenically-unsaturated monomers 1 together with 40 to 95 percent by weight of other addition polymerizable monomers. As is known in the art, considerable diversification exists among the techniques of polymerizing the various metal-carbonyl group-containing monomers, some being best polymerized using free radical initiators, others using a cationic or anionic initiator, some are better polymerized in a particular solvent, others in the bulk. Generally, the polymerization can be performed by agitation of a solution of monomers 1 with other monomers in an inert deoxygenated solvent at a temperature of about 50° to 150° C. for 5 to 50 hours or more in the presence of 0.1 to 10 weight percent of initiator, the solution being made to contain 10 to 75 percent by weight of total monomers. Preferably, the initiator is a free radical initiator. Additional description of the polymerization and copolymerization of ethylenically-unsaturated carbonyl group-containing monomers can be found in the previously cited reference to Pittman et al.

Ethylenically-unsaturated monomers 3 that can be copolymerized with the monomers 1 to provide the metal-carbonyl group-containing polymers required in the composition of the invention include any ethylenically-unsaturated monomeric or polymeric compound or mixture thereof. Since it is desirable that the metal-carbonyl group-containing polymer be soluble, there should be less than about one percent by weight of polyethylenic unsaturation in the monomers. Examples of suitable monomers include vinyl, allylic, acrylic, and methacrylic compounds such as the esters of unsaturated monocarboxylic acids or dicarboxylic acids, e.g., esters of acrylic acid, methacrylic acid, α-cyanacrylic acid, crotonic acid, cinnamic acid, sorbic acid, maleic acid, fumaric acid, or itaconic acid with aliphatic, cycloaliphatic, or aromatic alcohols of 1 to 20 carbon atoms, such as methyl acrylate and methacrylate, n-, iso-, and t-butyl acrylate and methacrylate, 2-ethylhexyl acrylate, lauryl acrylate, tetrahydrocyclopentadienyl acrylate and methacrylate, hydroxyethyl acrylate and methacrylate, ethyl α-cyanoacrylate, ethyl crotonate, ethyl sorbate, diethyl maleate, and dimethylfumarate; the amides of acrylic or methacrylic acid, e.g., N,N'-dimethylacrylamide, N-isobutylacrylamide, diacetoneacrylamide, N-methoxymethylacrylamide, N-butoxymethylmethacrylamide and N-phenylmethacrylamide; vinyl esters of monocarboxylic acids, e.g., vinyl acetate, vinyl propionate, vinyl 2-ethylhexanoate, and vinyl stearate; non-basic mono-N-vinyl compounds, e.g., N-vinylpyrrolidone, N-vinylpiperidone, N-vinylcaprolactam, N-vinyloxazolidone, N-vinylsuccinimide, N-methyl-N-vinylformamide, and N-vinylcarbazole; and vinyl ethers of monohydric alcohols of 1 to 20 carbon atoms, e.g., methyl vinyl ether, isobutyl vinyl ether, n-hexyl vinyl ether, and octadecyl vinyl ether.

Units derived from ethylenically-unsaturated monomer 2 that have at least one pendent nucleophilic group and are copolymerizable with monomer 1, are monomers designated in polymer art as "basic monomers". Such monomers have a polymerizable ethylenically-unsaturated group and a nucleophilic group (i.e., a group having an atom with an unshared pair of electrons) which will displace tetrahydrofuran from (cyclopentadienyl)(tetrahydrofuran)dicarbonylmanganese. Preferred nucleophilic groups are amino and phosphino groups. Examples of the preferred amino-substituted ethylenically-unsaturated monomers include the vinyl pyridines, such as 2-vinylpyridine, 4-vinylpyridine, 5-ethyl-2-vinylpyridine, 2-isopropenylpyridine, 5-isopropenyl-2-picoline, 2-vinylpyridine, 3-allyl-pyridine, 4-isobutenylpyridine and 4-vinyl-2,6-lutidine; and the amino-alkylacrylates and methacrylates such as 2-dimethylaminoethyl acrylate, 2-(pyrid-1-yl)ethyl acrylate, 2-(pyrid-2-yl)ethyl methacrylate, 2-(4-morpholinyl)ethyl acrylate, 2-diethylaminoethyl methacrylate, 2-methylaminoethyl acrylate, 2-aminoethyl acrylate, phenylaminoethyl methacrylate, 2-methoxyphenylaminoethyl acrylate, 6-(4-morpholinyl)hexyl methacrylate, N-methyl,N-ethylaminopropyl acrylate, 2-(1-piperidinyl)ethyl acrylate, and 2-(1-piperazinyl)ethyl methacrylate. Examples of preferred phosphino-substituted ethylenically unsaturated compounds include 1-vinylphosphorinane, 2-vinylphosphorin, 4-vinylphosphorin, and 2-(P,P-diphenyl)phosphinoethyl acrylate and methacrylate. A discussion of basic monomers and an extensive list of such monomers are given in Chapter 3, *Basic Monomers*, Leo S. Luskin of *Functional Monomers*, edited by R. H. Yocum and E. B. Nyquist, Marcel Dekker, Inc. (1974).

Suitable organic compounds (nucleophiles) that have two or more nucleophilic groups that can be used in Embodiment II of the composition of the invention are polyamino or polyphosphino compounds having a total of up to about 30 carbon atoms. Examples of such compounds include the alkylene polyamines such as 1,2-ethylenediamine, diethanolamine, N,N,N',N'-tetraphenyl-1,2-ethylenediamine, diethylenetriamine, triethylenetetramine, 1,3-propylenediamine, 1,4-butylenediamine, N,N,N',N'-tetramethyl-1,2-ethylenediamine and corresponding polyalkylalkylenepolyamines; cycloalkylenepolyamines such as 1,4-diaminocyclohexane, bis(4-aminocyclohexyl)methane and 1,4-bis(dimethylamino)cyclohexane; aromatic amines such as o-, m-, and p-phenylenediamine, benzimidazole, quinoxaline, phenazine, phenanthraphenazine, pyrazine, 2-methylpyrazine, 2,5-dichloropyrazine, 1,1-bipyrrolidine, 2,3'-biindole, 1,1'-biisoindole, s-triazine, and 5,12-dihydrobenzo[b]phenazine. Suitable phosphorous-containing nucleophilic compounds include 1,2-bis(diphenylphosphino)ethane, 1,3-bis(diphenylphosphino)propane, and 1,4-bis(diphenylphosphino)butane.

Suitable non-polymeric organic compounds substituted by two or more π-bonded metal-carbonyl groups that can be used in Embodiment IV of the composition of the invention are organometallic compounds having a total of up to about 40 carbon atoms. Examples of such compounds include:

1,3-bis[($\eta^5$-cyclopentadienyl)(tricarbonylmanganese)carbonyl]benzene 1,4-bis[($\eta^5$-cyclopentadienyl)(tricarbonylmanganese)carbonyl]benzene 1,2,4,5-tetra[($\eta^5$-cyclopentadienyl)(tricarbonylmanganese)carbonyl]benzene 1,2-bis[($\eta^5$-1(3)-methylcyclopentadienyl)(tricarbonylmanganese)carbonyloxy]ethane 1,4-bis[($\eta^6$-benzyl)(tricarbonylmolybdenum)oxycarbonyl]benzene 1,4-bis[($\eta^6$-benzyl)(tricarbonyltungsten)oxycarbonyl]benzene 1,4-bis[($\eta^6$-styryl)(tricarbonylchromium)]benzene 1,3[($\eta^5$-cyclopentadienyl)(tricarbonyliron)carbonyl]benzene bis(hexafluoroantimonate)

bis[($\eta^6$-phenyl)(tricarbonyl)chromium]

Suitable free radical generating compounds for effecting the polymerization of the monomers in the preparation of the metal-carbonyl-containing polymer of the invention are materials known in the art. Particularly suitable free radical generating compounds can be selected from many classes of organic compounds including, for example, organic peroxides, azo compounds, aromatic diazonium salts, aromatic iodonium salts, aromatic sulfonium salts, aromatic phosphonium salts, quinones, benzophenones, nitroso compounds, acyl halides, aryl halides, hydrazones, mercapto compounds, pyrylium compounds, triarylimidazoles, biimidazoles, and chloroalkyltriazines. These materials, in general, must have photosensitizers therewith to form a photoinitiator system useful with radiation above about 400 nm. Photosensitizers, such as spectrally absorbing dyes, are well known in the art.

Additional reference in the art to free radical photoinitiator systems for ethylenically unsaturated compounds are included in U.S. Pat. No. 3,887,450 (e.g., Col. 4), U.S. Pat. No. 3,895,949 (e.g., Col. 7), and U.S. Pat. No. 4,043,819. Preferred initiators are the onium salts as disclosed in U.S. Pat. Nos. 3,729,313; 4,058,400 and 4,058,401. Other desirable initiators are biimidazoles (disclosed in U.S. patent application Ser. No. 824,733, filed Aug. 15, 1977) and chloroalkyltriazines as disclosed in U.S. Pat. No. 3,775,113. These references also disclose sensitizers therein. Another good reference to photoinitiator systems is *Light-Sensitive Systems*, J. Kosar, J. Wiley and Sons, Inc. (1965), especially Chapter 5.

The radiation-crosslinkable composition can also contain a viscosity modifier or binder. Generally, up to about 50 percent by weight of a compatible polymer can be used as binder. Preferably, the binder polymer when used is an acrylic polymer such as poly(acrylic acid), a poly(methacrylic acid), or a copolymer of acrylic or ethacrylic acid with an alkyl acrylate such as methyl acrylate or methacrylate. Other modifying polymers include the polylacrylate and polymethacrylate esters of low molecular weight alcohols, poly(vinyl chloride), poly(vinylidene chloride), poly(vinylbutyral), polyethers, polyesters, polylactones, polyamides, polyurethanes, cellulose derivatives, and polysiloxanes.

The compositions of the invention can also include a variety of adjuvants utilized for their known purpose, such as polymeric organic diluents, stabilizers, inhibitors, lubricants, flexibilizers, pigments, carbon black, dyes, reinforcing fillers such as finely divided silica, non-reinforcing fillers such as diatomaceous earth, metal oxides, asbestos, fiberglass, glass bubbles, and talc. Fillers can generally be used in proportions up to about 200 parts by weight per 100 parts by weight of the curable components, but preferably are used up to about 50 parts by weight of adjuvants per 100 parts by weight of curable components. It is desirable that the adjuvants be transparent to the radiation used for effecting crosslinking.

The radiation-crosslinkable compositions of the invention are usually prepared by simply admixing a solution of the metal-carbonyl-containing component with the other desired ingredients in a suitable solvent. Where pigments are desired in the compositions, it may be necessary to use conventional high speed dispersing apparatus such as paint mills, ball mills, and the like.

The radiation-curable compositions are used to form crosslinked adherent coatings on substrates using substantially any technique known in the art including spraying, curtain coating, direct or reverse roll coating, dipping, brushing, extruding, and printing. However applied, the coatings are allowed to dry to remove solvent and leave a hard tack-free coating that in the absence of radiation remains soluble and can be removed from the substrate by treatment with a solvent. The dried coating is crosslinked by exposure to radiation for a sufficient time and intensity which may vary from about ten seconds to ten minutes or more depending on the thickness and particular composition of the coating.

Substrates which may be coated with the crosslinkable composition of the invention include organic substrates of wood, fiberboard, particle board, paper, and cardboard; synthetic and natural polymers such as polyesters, polyamides, cured phenolics, urea-aldehyde resins, polyacrylates, polyurethanes, proteins, rubber; inorganic substrates such as glass, quartz and ceramics; and metals such as iron, stainless steel, copper, brass, bronze, aluminum, titanium, nickel, zinc, and alloys. Particularly useful substrates are silicated aluminum and the polyesters such as polyethyleneterephthalate.

The coatings of the invention can have a thickness ranging from about 0.01 μm to about 1.0 mm or more. Coatings on a substrate such as silicated aluminum having a thickness of about 1 to 5 μm provide a radiation-sensitive lithographic plate which on exposure and development give images having excellent adhesion to the substrate and allow for the printing of 500 copies or more.

Coatings of the invention, particularly coatings of the composition in accordance with Embodiment II in which the polynucleophile is an organic compound, such as pyrazine, having nitrogen atoms in conjugation provide non-silver imaging systems when coated onto a substrate, especially a transparent substrate such as polyester, at a coating thickness of from about 1 μm to 10 μm. On exposure of such coatings to suitable radiation, color develops in from less than one minute to a deep color in five minutes or more. Unexposed areas of the coating can then be fixed against color development by heating or by solvent development.

Suitable radiation for crosslinking and forming color in the coatings of the invention include ultraviolet, visible light, infrared, or gamma radiation, preferably actinic radiation at wavelengths in the 200 to 700 nm range. Suitable sources include sunlight, carbon arcs, mercury-vapor arcs, fluorescent lamps, argon and xenon glow lamps, electronic flash units, photographic flood lamps and laser beams. Electron accelerators and electron beam sources may also be used.

In preparing printing plates, a layer of radiation-sensitive composition on a substrate, such as sheet aluminum, is exposed to radiation through a process transparency; that is, an image-bearing master consisting of areas substantially opaque and areas substantially transparent to the radiation. Exposed portions become crosslinked and bound to the substrate. During development of the plate using a solvent, preferably an acid-containing solvent, unexposed areas are removed from the substrate providing a negative working printing plate suitable for use in lithography in which the areas of crosslinked composition are ink receptive.

Solvents suitable for developing the exposed printing plate are preferably aqueous solutions of a mineral acid having a pH of 2 to 3 such as phosphoric acid, preferably containing a transition metal salt, e.g., copper or chromium sulfate, and optionally containing up to about 20 percent of a water soluble organic solvent such as isopropyl alcohol or methyl ethyl ketone.

The photocurable composition, particularly when coated on a substrate, is suitable for use in the graphic arts for the production of planographic or relief images, e.g., printing plates, and for use in the production of resist images, e.g., printed circuits. Certain embodiments of the composition cure on exposure to radiation to deeply colored, crosslinked resins, i.e., the exposed areas darken to a $D_{max}$ greater than 1.0, which make these embodiments suitable for use in information recording articles.

Objects and advantages of this invention are further illustrated by the following examples, but the particular materials and amounts thereof recited in these examples, as well as other conditions and details, should not be construed to unduly limit this invention.

EXAMPLE 1

Exemplification of Embodiment 1

Seven milliliters (about 40 mol percent) of a 50:50 mol percent mixture of 1-vinyl-2-(and -3-)methylcyclopentadienyltricarbonylmanganese and 7 ml of 4-vinylpyridine were dissolved in 30 ml of dry tetrahydrofuran containing 25 mg azobis(isobutyronitrile) in a Schlenk tube. The contents were then deoxygenated with a nitrogen stream and heated at 70° C. for two days whereon a viscous solution was obtained. The contents of the tube were diluted with 100 ml of tetrahydrofuran and, without isolation of polymer, the solution was coated onto a silicated aluminum sheet and dried providing a non-tacky film about 50 μm in thickness. The coated sheet was exposed in a vacuum frame through a stencil to irradiation from a 400 W mercury lamp (G.E. H400A33-1/T16) at a distance of 30 cm for one minute and developed by wiping with a dilute solution of phosphoric acid (pH=2-3) whereon the unexposed areas were removed and an article suitable as a printing plate was obtained. Using commercial fountain solution and rub-up ink, the developed sheet performed well on an offset printing press, making more than 800 copies with no sign of image degradation.

EXAMPLE 2

Example 1 was repeated except that 4 ml of 1-vinyl-2-(and -3-)methylcyclopentadienyltricarbonylmanganese (about 5 mol percent) and 8 ml of 4-vinylpyridine were used. A printing plate was prepared and run on an offset printing press as described in Example 1.

EXAMPLE 3

Example 1 was repeated with the exception that the polymer obtained following polymerization was isolated by slowly pouring the reaction mixture into petroleum ether, filtering the precipitated polymer and drying it to obtain about 80 percent yield of polymer. A 10 percent solution of the isolated polymer in tetrahydrofuran was coated onto silicated aluminum and dried in the dark. On exposure to radiation as described in Example 1 and development of the coated plate with dilute phosphoric acid and then wiping with commercial fountain solution and lithographic ink. The image obtained was of poor quality; the image, however, accepted ink in unexposed areas and rejected it in the exposed areas.

EXAMPLE 4

Example 2 was repeated with the exception that about 5 mg of Victoria Blue was added to the reaction solution before coating onto a silicated aluminum plate and drying it. The dried plate was exposed as described in Example 1 but was developed by wiping with a developer prepaed by adding 4 ml of concentrated phosphoric acid, 2 ml Igepal CO-630 (a nonionic surfactant available from GAF Company), and 2 g copper sulfate to 3.78 liters of water. Unexposed areas of the plate were removed leaving a blue-colored negative image.

EXAMPLE 5

Coated silicated aluminum plates, prepared as described in Example 4, were exposed for various times through a ten-step wedge to the radiation from a 400 W G.E. H400A33-1/T16 mercury lamp and developed with dilute phosphoric acid (pH of 2 to 3). The number of solid steps visible in the developed plates for the various times of exposure are set forth in Table I.

TABLE I

| Time of irradiation (seconds) | Observed Steps |
| --- | --- |
| 30 | 4 |
| 45 | 5 |
| 60 | 6–7 |
| 75 | 7–8 |
| 90 | 10 |
| 180 | 10 |

EXAMPLE 6

Vapor coated aluminum on 75 μm polyester film was coated with the solution as described in Example 1. When the coated film was exposed through a stencil to the irradiation from a 400 W mercury lamp at a distance of 30 cm for one minute and developed with dilute phosphoric acid (pH of 2 to 3), unexposed areas were removed leaving gold-colored exposed areas. On slow agitation of the developed film in dilute base (approximately 5 percent NaOH), the aluminum in the unexposed areas was removed leaving a "gold" negative on polyester film having some undercutting.

EXAMPLE 7

Two milliliters of a 50:50 mol percent mixture of 1-acryloyl-2-(and -3-)methylcyclopentadienyltricarbonylmanganese (the mixture prepared as described below) and 4 ml of 4-vinylpyridine were polymerized in 30 ml of dry tetrahydrofuran as described in Example 1. After heating the reaction mixture at 70° C. for two days, the precipitate which formed was filtered, then taken up in about 50 ml of methanol, and the solution was then coated onto primed polyester (75 μm). After drying in darkness, the coatings which were about 50 μm thick were exposed and developed as described in Example 1 to provide a pale yellow negative image of the stencil. When the coating was made onto silicated aluminum, yellow images were obtained but adhesion was poor.

The 50:50 mol percent mixture of 1-acryloyl-2-(and -3-)methylcyclopentadienyltricarbonylmanganese was prepared by slowly, simultaneously adding (over a period of about one hour) 20 g methylcyclopentadienyltricarbonylmanganese in about 20 ml of carbon disulfide and 12.4 g of freshly distilled acryloyl chloride in about 20 ml of carbon disulfide to a 250 ml 3-necked flask equipped for reflux containing 16.3 g aluminum chloride suspended in about 50 ml of carbon disulfide. After the addition was completed, the contents were heated at reflux for one hour and then poured into a mixture of 150 g ice and 30 ml of concentrated hydrochloric acid. This mixture was stirred until hydrolysis of the aluminum salts was complete. The carbon disulfide phase was separated, dried, and distilled.

EXAMPLE 8

One part of styrenetricarbonylchromium (prepared in the manner described in the 1977 Pittman reference, page 51, supra) and two parts by weight of 4-vinylpyridine were polymerized as described for the copolymerization in Example 1. After two days at 70° C., a small amount of precipitate was removed from the viscous reaction mixture by filtration. The filtrate was coated onto silicated aluminum and dried in the dark, forming a coating about 50 μm thick. After exposing through a stencil to the irradiation from a 400 W mercury lamp at 30 cm distance for two minutes, and developing by wiping with the developer described in Example 4, a negative image was obtained with good adhesion.

EXAMPLE 9

In accordance with the general procedure of Example 1, a terpolymer was prepared by heating a solution of 5 ml of the 1-vinyl-2-(and -3-)methylcyclopentadienyltricarbonylmanganese, 10 ml of 4-vinylpyridine, and 15 ml of N-vinyl-2-pyrrolidone in 30 ml of dry tetrahydrofuran containing 25 mg of azobis-(isobutyronitrile) for two days at 70° C. After precipitation occurred as described in Example 3, there was obtained about 80 percent yield of polymer that analyzed by nmr to be 6, 84 and 10 mol percent of vinylmethylcyclopentadienyltricarbonylmanganese, 4-vinylpyridine, and N-vinylpyrrolidone respectively.

A 10 percent solution of the polymer in tetrahydrofuran was coated onto polyester and dried in the dark to a coating of about 50 μm thickness. After exposure through a stencil to irradiation from a 400 W mercury lamp at 30 cm distance for two minutes, the coating became yellow in exposed areas. By wiping the exposed film with dilute phosphoric acid, unexposed areas of the film were removed. Similar results were obtained when an aluminum substrate was coated in identical fashion.

EXAMPLE 10

One part of (2-phenylethyl acrylate)tricarbonylchromium (prepared as described by Pittman in the monographic series titled Organometallic Reactions and Synthesis, 6, 52 (1977) cited above) and two parts of 4-vinylpyridine were polymerized as described in Example 1. The polymer obtained was coated onto primed polyester as described in Example 7, dried and exposed through a stencil. Exposed areas were pale yellow.

EXAMPLE 11

A copolymer of 4-vinylpyridine and (2-phenylethylacrylate)tricarbonylmolybdenum [(prepared as described in Example 10 for the preparation of (2-phenylethylacrylate)tricarbonylchromium using hexacarbonylmolybdenum in place of hexacarbonylchromium] was prepared using the procedure of Example 1. The copolymer obtained was coated onto silicated aluminum, the coating was then dried and exposed as described in Example 10. The exposed sheet was developed with the developer of Example 4. It accepted ink in the exposed areas.

EXAMPLE 12

A copolymer of 2-aminoethylacrylate and (2-phenylethylacrylate)tricarbonyl tungsten (prepared as described in Example 10 for the preparation of (2-phenylethylacrylate)tricarbonylchromium using hexacarbonyltungsten in place of hexacarbonylchromium)

was prepared and precipitated in petroleum ether. The copolymer obtained was dissolved in ethyl acetate to form a 20 percent solution, coated, the coating was then dried and exposed as described in Example 10. The exposed sheet was developed with dilute phosphoric acid (pH of 2) leaving a negative image.

EXAMPLE 13

Exemplification of Embodiment 2

Twenty-five milliliters of freshly distilled styrene and 10 ml of 50:50 mol percent mixture of 1-vinyl-2-(and -3-)methylcyclopentadienyltricarbonylmanganese (the mixture was prepared in the manner described by Pittman in Becker and Tsutsui, "Organometallic Reactions and Synthesis", Vol. 6, p. 50) were added to 30 ml of ethyl acetate containing 23 mg azobis(isobutyronitrile) in a Schlenk tube. The contents of the tube were deoxygenated by three freeze-evacuate-thaw cycles using nitrogen or argon to break the vacuum. The tube was then flooded with nitrogen or argon; the contents were heated to 70° C., the tube openings were closed; the tube was wrapped in metal foil to exclude any ambient ultraviolet; and it was held at 70° C. for five days. At the end of this time, the viscous contents were cooled to room temperature, and then taken up in an approximately equal volume of ethyl acetate, and then slowly poured into rapidly stirred petroleum ether to precipitate a pale yellow copolymer. The copolymer was further purified by dissolving it in ethyl acetate and again precipitating it in petroleum ether two more times. After drying, there was obtained about 80 percent yield of pale yellow copolymer which contained 14 mol percent of vinylmethylcyclopentadienylmanganese as analyzed by nuclear magnetic resonance.

An ethyl acetate solution containing 0.75 g of the copolymer described above and 0.22 g of pyrazine was coated onto 75 micrometer polyester film, the film was dried and was maintained in the dark. On exposure of the coated film in a vacuum frame for ten minutes through a stencil to the irradiation from a 400 W mercury lamp (G.E. H400A33-1/T16) at a distance of 30 cm, there was obtained in the exposed areas a blue-black image having an optical density of 2.4. By heating the exposed film at 110° C. for about five minutes, pyrazine was volatilized from the unexposed areas, stabilizing these areas against color formation.

A portion of the exposed coated film was wiped for ten seconds with a sponge that had been wet with a 50:50 methanol:tetrahydrofuran solution. Unexposed areas of the coated film were selectively removed leaving a blue-black relief image of the exposed portions of the coated film.

A portion of the coated film was exposed as described above through a United States Air Force lens test target. Following stabilization by heating at 110° C. for five minutes, images having a resolution of greater than 400 line pairs per millimeter were obtained.

EXAMPLE 14

Two grams of a copolymer containing 10 mol percent of a 50:50 mol percent mixture of 1-vinyl-2-(and -3-)methylcyclopentadienyl manganese tricarbonyl (prepared as described in Example 13) and 90 mol percent of styrene were dissolved in 8 ml of ethyl acetate containing 0.4 g pyrazine and coated onto 75 μm polyester film, and the coated film was then dried in the dark. On exposure in a vacuum frame for ten minutes through a stencil, as described in Example 13, a blue-black image having an optical density of 2.4 was obtained. When the run was repeated except that 0.020 g of benzophenone was added to the coating solution, only two minutes were required to produce an image having an optical density of 2.4.

EXAMPLE 15

Example 14 was repeated using in place of pyrazine the organic bidentate compounds that have at least two nucleophilic groups listed in Table II. The color of the images obtained is set forth in Table II.

TABLE II

| Bidentate Compound | Image Color |
| --- | --- |
| 4,4'-Bipyridine | red-violet |
| Quinoxaline | violet |
| 2-Methylpyrazine | red-brown |
| 2,6-Dichloropyrazine | violet |
| 1,2-bis(diphenylphosphino)ethane | no color (a) |
| ethylenediamine | no color (a) |
| 1,4-diazobicyclo[2.2.2]octane | no color (a) |

(a) When bidentate compounds bearing two amino or phosphorous groups that are not conjugated are used in the coating composition, appreciable color is not obtained on exposure.

EXAMPLE 16

The polymerization procedure of Example 13 was repeated using 10 ml of methyl methacrylate, 10 ml of a 50:50 mixture of 1-vinyl-2-(and -3-)methylcyclopentadienyltricarbonylmanganese in 20 ml of ethyl acetate containing 28.2 mg of azobis(isobutyronitrile). Following reprecipitation and drying, there was obtained about 80 percent of polymer which on analysis by nmr was shown to be 30 mol percent vinylmethylcyclopentadienyltricarbonylmanganese and 70 mol percent of methyl methacrylate.

Polyester film (75 μm thick) was coated with an ethyl acetate solution containing one gram of the above-described polymer and 0.3 g of pyrazine (coating obtained was about 50 μm thick), then dried and stored as described in Example 13. On exposure in a vacuum frame for ten minutes through a stencil as described in Example 13, the exposed areas became blue-black.

EXAMPLE 17

The polymerization procedure of Example 13 was repeated using 10 g of styrenetricarbonylchromium and 10 g of styrene in 20 ml of ethyl acetate containing 25 mg azobis(isobutyronitrile). There was obtained a polymer containing about 10 mol percent of styrenetricarbonylchromium. Into 10 ml of ethyl acetate was dissolved one gram of the polymer and 0.3 g pyrazine and the solution thus prepared was coated onto 75 μm polyester film. The coating was dried in the dark giving a film about 50 m thick. The dried coating was exposed in a vacuum frame through a stencil as described in Example 13. Exposed areas of the film became bluish after about 30 seconds and dark violet after about two minutes.

On repeating the above example using 4,4'-bipyridine in place of pyrazine, similar dark violet images were obtained after two minutes exposure.

EXAMPLE 18

In accordance with the procedure of Example 13, a copolymer was prepared using methyl methacrylate in place of styrene. There was obtained about 40 percent yield of pale yellow copolymer which nmr analysis showed to be a mixture of 20 mol percent of vinylmethylcyclopentadienylmanganese and 80 mol percent of methyl methacrylate.

Into 2 ml of ethyl acetate was dissolved 250 mg of the above copolymer and 40 mg of 1,2-bis(diphenylphosphino)ethane. The yellow solution was coated onto 75 μm polyester film and was then dried using a heat gun. The coated film was exposed for five minutes through a stencil in a Colight unit and the nearly colorless (very pale amber) exposed film was washed with acetone and was then rinsed with water. There was obtained a negative relief image (unexposed areas were washed away) having extremely good adhesion to the polyester substrate (that is, the image could not be removed using pressure sensitive adhesive tape).

EXAMPLE 19

When Example 18 was repeated using 40 mg of ethylenediamine in place of the 1,2-bis(diphenylphosphino)ethane, there was obtained a coating which became very pale orange in exposed areas. Upon rinsing with acetone, a negative relief image was obtained having good adhesion to the polyester substrate (that is, the image could not be removed using pressure sensitive adhesive tape). On exposure of the coating through a ten-step wedge and developing the exposed film with acetone, seven steps could be seen.

EXAMPLE 20

When Example 18 was repeated using 40 mg of 1,4-diazobicyclo[2.2.2.]octane in place of 1,2-bis(diphenylphosphino)ethane, pale orange negative relief images were obtained. On exposure of the coating through a ten-step wedge and developing the exposed film with acetone, four steps could be seen.

EXAMPLE 21

The polymerization procedure of Example 13 was repeated using 10 ml of (2,4-hexadiene-1-ylacrylate)-tricarbonyliron (prepared as described by Pittman in the monographic series titled Organometallic Reaction 6, 55 (1977) that was previously cited) and 10 ml of styrene in 20 ml of ethylacetate containing 25 mg azobis(isobutyronitrile). One gram of the polymer obtained was dissolved in 10 ml of ethyl acetate and 0.3 g of pyrazine added. The solution obtained was coated onto polyester film and dried in the dark giving a coating about 50 μm thick. On exposure of the coating for about 30 seconds in a vacuum frame as described in Example 13, dark images were obtained in the exposed areas.

EXAMPLE 22

Exemplification of Embodiment 3

One gram of the 14:86 mol percent copolymer of 1-vinyl-2-(and -3-)methylcyclopentadienylmanganesetricarbonyl:styrene described in Example 13 and 1 gram of commercial 90:10 poly(4-vinylpyridine-co-styrene) (available from Aldrich Chem. Co.) were dissolved in 20 ml of ethyl acetate. The solution obtained was coated onto primed polyester and dried. The coated sheet was exposed through a stencil to the radiation of a 400 W mercury lamp at 30 cm for 5 minutes. The exposed sheet was developed with an 80/20 tetrahydrofuran/water solution to remove unexposed regions leaving a negative image.

EXAMPLE 23

Exemplification of Embodiment 4

A 10% solution of the 90:10 poly(4-vinylpyridine-co-styrene) (available from Aldrich Chem. Co.) in tetrahydrofuran was prepared. Into 2 grams of this solution was dissolved 0.004 g of 1,3-bis[($\eta^5$-2(3)-methylcyclopentadienyl)(tricarbonylmanganese)carbonyl]benzene (prepared as described below) and this solution was coated onto polyester film and dried. The coating was exposed as described in Example 22 for 2 minutes and developed as described in Example 4. There was obtained a negative image having excellent adhesion to the polyester film.

1,3-bis[($\eta^5$-2(3)-methylcyclopentadienyl)(tricarbonylmanganese)carbonyl]benzene was prepared by adding simultaneously over a period of about 60 minutes from separate addition funnels 25 g methylcyclopentadienyltricarbonylmanganese and 6 g isophthaloyl chloride to a stirred solution of 6 g aluminum chloride in about 50 ml of carbon disulfide at 20° C. The solution obtained was heated at reflux for one hour, then cooled to 0° C., and the reaction mixture was poured into 100 g of ice and 25 ml of conc. HCl. The quenched mixture was extracted with chloroform, the chloroform extracts were combined, then dried over magnesium sulfate and then distilled to remove chloroform. The solid which was obtained as residue was worked with ethanol removing unreacted starting material. Purification was effected by recrystallization from a 50:50 percent volume mixture of methylene chloride and pentane. The infrared and NMR spectra of the yellow crystals which were obtained were consistent with the expected structure.

EXAMPLE 24

A solution prepared as described in Example 23 was coated onto aluminum vapor coated polyester film and then dried. After a 30 second exposure as described in Example 22, and development as described in Example 4, a negative image having good adhesion was obtained.

When the polyester film was replaced by smooth silicated aluminum, a negative image was obtained. Adhesion of the image, however, was poor.

EXAMPLE 25

Example 23 was repeated using 1,4-bis[($\eta^5$-2(3)-methylcyclopentadienyl)(tricarbonylmanganese)carbonyl]butane in place of 1,3-bis[$\eta^5$-2(3)-methylcyclopentadienyl)(tricarbonylmanganese)carbonyl]benzene. The former compound was prepared in the same manner as the latter except that adipoyl chloride was used in place of isophthaloyl chloride. The coated film obtained was tacky, but became tack free in exposed areas. On development as described in Example 4, a negative image having good ahesion was obtained.

Various modifications and alterations of this invention will become apparent to those skilled in the art without departing from the scope and spirit of this invention, and it should be understood that this invention is not to be unduly limited to the illustrative embodiments set forth herein.

I claim:

1. A radiation-sensitive, crosslinkable composition comprising at least 10 percent by weight of components selected from I, II, III, and IV, wherein I is a composition comprising a copolymer of (a) units derived from monomer 1, a radiation-sensitive conjugated polyolefin substituted by both a polymerizable ethylenically-unsaturated group and by a π-bonded metal-carbonyl group,
(b) units derived from monomer 2, a monomer having at least one nucleophilic group, and
(c) optionally, units derived from monomer 3, a non-nucleophilic monomer;

II is a composition comprising:
(a) a polymer having units derived from monomer 1, and
(b) a non-polymeric polynucleophilic compound having two to four nucleophilic groups;

III is a composition comprising:
(a) a polymer of units derived from monomer 1, and
(b) a polymer of units derived from monomer 2; and IV is a composition comprising:
(a) a polymer of monomer 2, and
(b) a non-polymeric radiation-sensitive organic compound substituted by two or more π-bonded metal-carbonyl groups;

said nucleophilic groups being capable of displacing tetrahydrofuran from (cyclopentadienyl)(tetrahydrofuran)dicarbonylmanganese in solution of tetrahydrofuran at about 25° C. under nitrogen in less than one hour.

2. The radiation crosslinked reaction product of the composition according to claim 1.

3. A radiation-sensitive composition comprising at least 10 percent by weight of components selected from I, II, III and IV, wherein:

I is equal to 0 to 100 percent by weight of a copolymer comprising:
(a) 5 to 60 mol percent of units derived from monomer 1,
(b) 5 to 40 mol percent of units derived from monomer 2,
(c) 0 to 90 mol percent of units derived from monomer 3; and II is equal to 0 to 100 percent by weight of a composition comprising:
(a) 75 to 95 percent by weight of a copolymer comprising:
(1) 5 to 60 mol percent of units derived from monomer 1, and
(2) 95 to 40 mol percent of units derived from monomer 3, and
(b) 25 to 5 percent by weight of a polynucleophile; and III is equal to 0 to 100 percent by weight of a composition comprising:
(a) 10 to 80 percent by weight of a polymer comprising 5 to 60 mol percent of units derived from monomer 1, and 95 to 40 mol percent of units derived from monomer 3, and
(b) 90 to 20 percent by weight of a polymer comprising 5 to 100 mol percent of units derived from monomer 2, and 95 to 0 mol percent of units derived from monomer 3; and IV is equal to 0 to 100 percent by weight of a composition comprising:
(a) 75 to 95 percent by weight of a copolymer comprising:
(1) 5 to 100 mol percent of units derived from monomer 2, and
(2) 95 to 0 mol percent of units derived from monomer 3, and
(b) 25 to 5 percent by weight of a non-polymeric radiation-sensitive organic compound substituted by two to four π-bonded metal-carbonyl groups; and up to 90 percent by weight of organic polymeric binders, fillers, or other adjuvants; wherein:

monomer 1 is a radiation-sensitive, conjugated polyolefin substituted by an ethylenically-unsaturated group and π-bonded to a metal-carbonyl having the formula

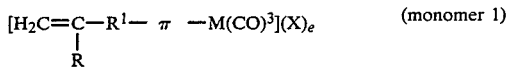  (monomer 1)

wherein:
R is a hydrogen or methyl;
$R^1$ is (1) a covalent bond, or (2) a divalent group,

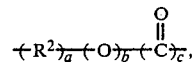

in which $R^2$ is an alkylene or alkyenylene group having 1 to 4 carbon atoms, a, b, and c are independently zero or one, but at least one of a, b, and c is one;

π is a cyclic or linear conjugated polyolefinic ligand that provides 4 to 7 π electrons to the valence shell of M and has 4 to 7 carbon atoms, one of which is attached to the covalent bond or divalent group $R^1$, said π optionally being substituted by halogen and lower alkyl groups having 1 to 6 carbon atoms or by a fused benzo group;

M is a metal selected from chromium, molybdenum, tungsten, manganese, and iron;

X is a non-nucleophilic counterion;

e is zero or one, e being zero when the sum of electrons available from 3CO groups, the conjugated polyolefin and the metal is 18, and e being one when the sum is 19;

monomer 2 is an ethylenically-unsaturated monomer having at least one pendent nucleophilic group and being copolymerizable with monomer 1;

monomer 3 is an ethylenically-unsaturated monomer copolymerizable with monomers 1 and 2;

said nucleophilic groups being capable of displacing tetrahydrofuran from (cyclopentadienyl)(tetrahydrofuran)dicarbonyl manganese in solution in tetrahydrofuran at about 25° C. under nitrogen in less than one hour.

4. The composition according to claim 3 wherein said monomer 1 is selected from the class consisting of (1-vinyl-2-methylcyclopentadienyl)tricarbonylmanganese, (1-vinyl-3-methylcyclopentadienyl)tricarbonylmanganese, (1-acryloyl-2-methylcyclopentadienyl)tricarbonylmanganese, (1-acryloyl-3-methylcyclopentadienyl)tricarbonylmanganese, (styrene)tricarbonylchromium, (2-phenylethyl acrylate)tricarbonylchromium, and (2-phenylethylacrylate)tricarbonylmolybdenum.

5. The composition according to claim 3 wherein said monomer 2 is selected from the class consisting of polymerizable ethylenically unsaturated monomers substituted by at least one amino or phosphino group.

6. The composition according to claim 5 wherein said ethylenically unsaturated monomer substituted by at least one amino or phosphino group is selected from the class consisting of 4-vinylpyridine, 2-aminoethyl acrylate, 2-methylaminoethyl acrylate, and 4-vinylphosphorin.

7. The composition according to claim 3 wherein said monomer 3 is selected from the class consisting of alkylene polyamines, cycloalkylene polyamines, aromatic polyamines and phosphorous-containing nucleophilic compounds.

8. The composition according to claim 3 wherein said polynucleophile is selected from the class consisting of polyamino and polyphosphino compounds having a total of up to 30 carbon atoms.

9. The composition according to claim 7 wherein said monomer 3 compounds are selected from the class consisting of 1,2-ethylenediamine, diethanolamine, 1,4-diaminocyclohexane, p-phenylenediamine, pyrazine, and 1,2-bis(diphenylphosphino)ethane.

10. The composition according to claim 3 wherein said non-nucleophilic counterion is selected from the class consisting of ions having the formula $$MQ_d$$

wherein M is a metal or metalloid, Q is a halogen radical, and d is an integer having a value of from 4 to 6 inclusive.

11. The composition according to claim 3 wherein said non-nucleophilic counterion is selected from the class consisting of $AsF_6^{-1}$, $SbF_6^{-1}$, $BF_4^{-1}$, $PF_6^{-1}$, $CF_3SO_4^-$, $FeCl_4^-$, $C_6H_5SO_3^-$, $ClO_4^-$, and $(C_6H_5)_4B^-$.

12. The composition according to claim 3 further comprising 0.1 to 10 weight percent of a polymerization initiator.

13. The composition according to claim 3 further comprising up to 90 percent by weight of compatible adjuvants selected from polymeric organic diluents, fillers, viscosity modifiers, binders, stabilizers, inhibitors, lubricants, flexibilizers, pigments, and dyes.

14. The radiation-crosslinked reaction product of the composition according to claim 3.

15. A method of curing the composition according to claims 1 or 3, which method comprises exposing said composition to actinic radiation or an electron beam.

16. A radiation-sensitive element comprising:
(a) a substrate, and
(b) a radiation-sensitive crosslinkable composition coated on at least one surface thereof, said composition comprising at least 10 percent by weight of components selected from I, II, III, and IV, wherein
I is a composition comprising a copolymer of
  (a) units derived from monomer 1, a radiation-sensitive, conjugated polyolefin substituted by both a polymerizable ethylenically-unsaturated group and by a π-bonded metal-carbonyl group,
  (b) units derived from monomer 2, a monomer having at least one nucleophilic group, and
  (c) optionally, units derived from monomer 3, a non-nucleophilic monomer;
II is a composition comprising:
  (a) a polymer having units derived from monomer 1, and
  (b) a non-polymeric polynucleophilic compound having two to four nucleophilic groups;
III is a composition comprising:
  (a) a polymer of units derived from monomer 1, and
  (b) a polymer of units derived from monomer 2, and
IV is a composition comprising:
  (a) a polymer of monomer 2, and
  (b) a non-polymeric radiation-sensitive organic compound substituted by two or more π-bonded metal-carbonyl groups;
said nucleophilic groups being capable of displacing tetrahydrofuran from (cyclopentadienyl)(tetrahydrofuran)dicarbonylmanganese in solution in tetrahydrofuran at about 25° C. under nitrogen in less than one hour.

17. The element according to claim 16 wherein the substrate is suitable for making a lithographic printing plate.

18. A method of crosslinking a composition to render it insoluble in a solvent that is effective to dissolve the non-crosslinked portions of the composition comprising imagewise exposing to activating radiation a radiation-sensitive, cross-linkable composition comprising at least 10 percent by weight of a composition selected from the group consisting of a composition comprising a copolymer comprising a recurring unit derived from a monomer of a conjugated polyolefin substituted by both a polymerizable ethylenically-unsaturated group and by a radiation-sensitive π-bonded metal-carbonyl group and a recurring unit having a nucleophilic group and a composition comprising a polymer comprising a recurring unit having a nucleophilic group and a polymer comprising a recurring unit derived from a monomer of a conjugated polyolefin substituted by both a polymerizable ethylenically-unsaturated group and by a radiation-sensitive π-bonded metal-carbonyl group.

19. A radiation-sensitive, cross-linkable composition comprising at least 10 percent by weight of a polymer comprising a recurring unit having a nucleophilic group and a nonpolymeric, radiation-sensitive organic compound substituted by two or more π-bonded metal-carbonyl groups.

* * * * *

UNITED STATES PATENT AND TRADEMARK OFFICE
CERTIFICATE OF CORRECTION

PATENT NO. : 4,503,140

DATED : March 5, 1985

INVENTOR(S) : Robin E. Wright

It is certified that error appears in the above-identified patent and that said Letters Patent is hereby corrected as shown below:

In Claim 3, col. 20, lines 15-16 it reads:

It should read:

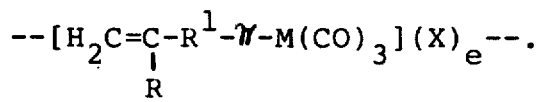

Signed and Sealed this

Twenty-sixth Day of November 1985

[SEAL]

Attest:

DONALD J. QUIGG

Attesting Officer

Commissioner of Patents and Trademarks